(12) United States Patent
Jheng

(10) Patent No.: US 8,300,200 B2
(45) Date of Patent: Oct. 30, 2012

(54) FAN-OUT CIRCUIT AND DISPLAY PANEL

(75) Inventor: Geng-Cyuan Jheng, Chiayi (TW)

(73) Assignee: Au Optronics Corporation, Hsinchu (TW)

( * ) Notice: Subject to any disclaimer, the term of this patent is extended or adjusted under 35 U.S.C. 154(b) by 346 days.

(21) Appl. No.: 12/647,522

(22) Filed: Dec. 27, 2009

(65) Prior Publication Data

US 2011/0075089 A1    Mar. 31, 2011

(30) Foreign Application Priority Data

Sep. 30, 2009   (TW) ................. 98133260 A

(51) Int. Cl.
*G02F 1/1345*   (2006.01)
(52) U.S. Cl. ........................ 349/152; 349/149
(58) Field of Classification Search .......... None
See application file for complete search history.

(56) References Cited

U.S. PATENT DOCUMENTS

| | | | |
|---|---|---|---|
| 5,870,163 A | 2/1999 | Watanabe et al. | |
| 6,879,367 B2 | 4/2005 | Ukita | |
| 7,271,871 B2 | 9/2007 | Jen et al. | |
| 2007/0080433 A1* | 4/2007 | Lai | 257/666 |
| 2007/0085963 A1* | 4/2007 | Huang et al. | 349/152 |
| 2007/0216845 A1 | 9/2007 | Liao et al. | |

FOREIGN PATENT DOCUMENTS

| | | |
|---|---|---|
| CN | 1746966 | 3/2006 |
| CN | 1811540 A | 8/2006 |
| JP | 2003-005670 | 1/2003 |
| TW | 200732738 | 9/2007 |

OTHER PUBLICATIONS

"First Office Action of China Counterpart Application," issued on Sep. 30, 2010, p. 1-p. 4.
"Notice of Allowance and Search Report of China Counterpart Application", issued on Sep. 23, 2012, p1-p3, in which the listed references were cited.

* cited by examiner

*Primary Examiner* — Thanh-Nhan P Nguyen
(74) *Attorney, Agent, or Firm* — Jianq Chyun IP Office

(57) ABSTRACT

A fan-out circuit including a plurality of fan-out wires is provided, where the fan-out wires are not electrically connected to each other. Each of the fan-out wires includes a first detouring portion, an extending portion, and a second detouring portion. The first detouring portion has a chip bonding terminal and a first connecting terminal. A pitch of any two adjacent chip bonding terminals is P1. The second detouring portion has a second connecting terminal and a signal-line connecting terminal. The second connecting terminal is connected with the first connecting terminal through the extending portion. A pitch of any two adjacent signal-line connecting terminals is P2, and P2>P1. Among the fan-out wires, a part of the first detouring portions has a ladder shaped pattern.

17 Claims, 5 Drawing Sheets

FAN-OUT CIRCUIT AND DISPLAY PANEL

CROSS-REFERENCE TO RELATED APPLICATION

This application claims the priority benefit of Taiwan application serial no. 98133260, filed on Sep. 30, 2009. The entirety of the above-mentioned patent application is hereby incorporated by reference herein and made a part of specification.

BACKGROUND OF THE INVENTION

1. Field of the Invention

The invention relates to a fan-out circuit, and in particular, to a fan-out circuit with a small impedance difference and a display panel having the above-mentioned fan-out circuit.

2. Description of Related Art

With advantages of high definition, small volume, light weight, low driving voltage, low power consumption, and a wide range of applications, a liquid crystal display (LCD) has replaced a cathode ray tube (CRT) display and has become the mainstream display apparatus in the next generation. A conventional LCD panel is constituted by a color filter substrate having a color filter layer, a thin film transistor (TFT) array substrate, and a liquid crystal (LC) layer sandwiched between the color filter substrate and the TFT array substrate.

FIG. 1A is a schematic view of a conventional LCD panel. Referring to FIG. 1A, a conventional LCD panel 100 is divided into an active area 102 and a peripheral circuit area 104. A plurality of pixels 110 are disposed in the active area 102 to form a pixel array (not shown), and peripheral circuits 120 are formed in the peripheral circuit area 104. Each pixel 110 includes a TFT 112 and a pixel electrode 114 connected to the TFT 112. Each pixel 110 is surrounded by two adjacent scan lines 116 and two adjacent data lines 118. Usually, the scan lines 116 and the data lines 118 extend from the active area 102 to the peripheral circuit area 104 and are electrically connected to driver ICs 130 through the peripheral circuits 120. Generally, the driving ICs 130 have a particular design specification, so that the peripheral circuits 120 extend toward the driving ICs 130 from the terminals connecting the scan lines 116 and the data lines 118, so as to constitute a fan-out circuit 140.

FIG. 1B illustrates an enlarged schematic view of a fan-out circuit in the LCD panel shown in FIG. 1A. Referring to FIG. 1A and FIG. 1B simultaneously, each fan-out circuit 140 has a plurality of conductive lines 142. A distance between two terminals of conductive lines 142a on edges in an X direction is different from a distance between two terminals of conductive lines 142b at a center in the X direction. That is, with the different relative positions between the driving ICs 130 and the corresponding scan lines 116 or between the driving ICs 130 and the corresponding data lines 118, each conductive line 142 has a different length. Thus, the conductive lines 142 have notable impedance differences.

In order to reduce the impedance differences between the conductive lines 142, a part of the conductive lines 142 are designed with detouring portions 144 in many conventional techniques. The detouring portions 144 increases the length of the conductive lines 142 to adjust the impedance of different scan lines 116 or different data lines 118. However, a pitch between adjacent conductive lines 142 is usually fixed. The detouring portions 144 can only be circuitously arranged within this pitch. Consequently, the design of the detouring portions 144 merely reduces the impedance differences between the conductive lines 142 slightly. In other words, the outermost conductive lines 142a and the center conductive lines 142b of the same fan-out circuit 140 still have notable impedance differences.

SUMMARY OF THE INVENTION

The invention is directed to a fan-out circuit with a part of detouring portions having a ladder shaped pattern, so that the impedance matching between conductive lines is enhanced.

The invention is further directed to a display panel, in which a design of a fan-out circuit thereof enhances a transmission quality of the display panel.

The invention is directed to a fan-out circuit including a plurality of fan-out wirings that are not electrically connected to each other. Each fan-out wiring includes a first detouring portion and an extending portion. The first detouring portion has a chip bonding terminal and a first connecting terminal. A pitch of any two adjacent chip bonding terminals is P1. The extending portion has a first terminal and a second terminal. The first terminal is connected to the first connecting terminal. A pitch of any two adjacent second terminals is P1' and P1'>P1. In the fan-out wirings, a part of the first detouring portions has a ladder shaped pattern.

According to an embodiment of the invention, another part of the first detouring portions has the ladder shaped pattern and a zigzag pattern. The fan-out wirings are arranged on respective sides of a virtual center line, for example. Moreover, a shortest distance between the virtual center line and the chip bonding terminal of a part of the first detouring portions is D1, a shortest distance between the virtual center line and the first connecting terminal of a part of the first detouring portions is D2, and D1<D2. A zigzag margin of the zigzag pattern is, for example, gradually reduced from the virtual center line to the respective sides. A length of the zigzag pattern is, for example, gradually reduced from the virtual center line to the respective sides.

According to an embodiment of the invention, another part of the first detouring portions has a ladder shaped pattern and a zigzag pattern, and a remaining part of the first detouring portions has a stripe pattern. The fan-out wirings are arranged on respective sides of a virtual center line, for example. Moreover, a shortest distance between the virtual center line and the chip bonding terminal of a part of the first detouring portions is D1, a shortest distance between the virtual center line and the first connecting terminal of a part of the first detouring portions is D2, and D1<D2. A zigzag margin of the zigzag pattern is gradually reduced from the virtual center line to the respective sides. A length of the zigzag pattern is, for example, gradually reduced from the virtual center line to the respective sides.

According to an embodiment of the invention, the fan-out wirings are arranged on respective sides of a virtual center line. In addition, the first detouring portions of the fan-out wirings become longer as the chip bonding terminal gets closer to the virtual center line.

According to an embodiment of the invention, the fan-out wirings are symmetrically arranged on respective sides of a virtual center line.

According to an embodiment of the invention, each fan-out wiring further has a second detouring portion. The second detouring portion has a second connecting terminal and a signal-line connecting terminal. The second connecting terminal is connected to the first connecting terminal through the extending portion. A pitch of any two adjacent signal-line connecting terminals is P2, and P2>P1.

The invention is further directed to a display panel. The display panel includes a display unit array and a fan-out circuit aforementioned. The display unit array is disposed within a display region and includes a plurality of signal lines. The fan-out circuit is disposed within a fan-out region. The fan-out wirings are each electrically connected to a corresponding signal line.

In light of the foregoing, a part of the detouring portions in the fan-out wirings of the fan-out circuit of the invention has a ladder shaped pattern. Hence, the two terminals of the detouring portions and the virtual center line of the fan-out circuit have different distances therebetween, so that a wider region is preserved in the fan-out circuit. The other detouring portions utilize the preserved regions to make the impedance adjustment more flexible. In short, the impedance difference between the fan-out wirings in the fan-out circuit of the invention can be compensated more efficiently, thereby resulting in a uniform signal transmission quality. Therefore, the adoption of the fan-out circuit in the display panel enhances the quality of the display panel.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
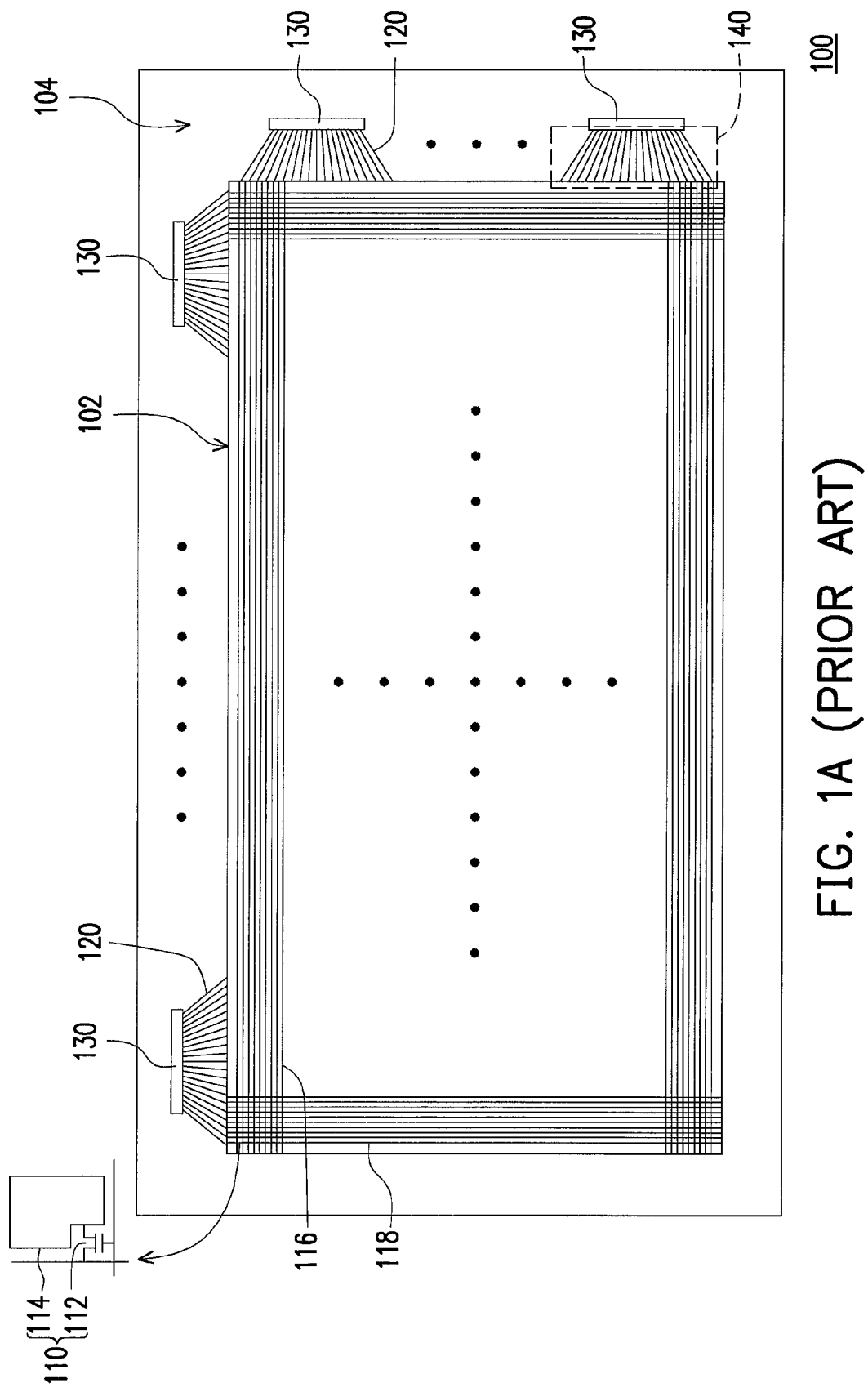
FIG. 1A is a schematic view of a conventional LCD panel.
Figure 1B:
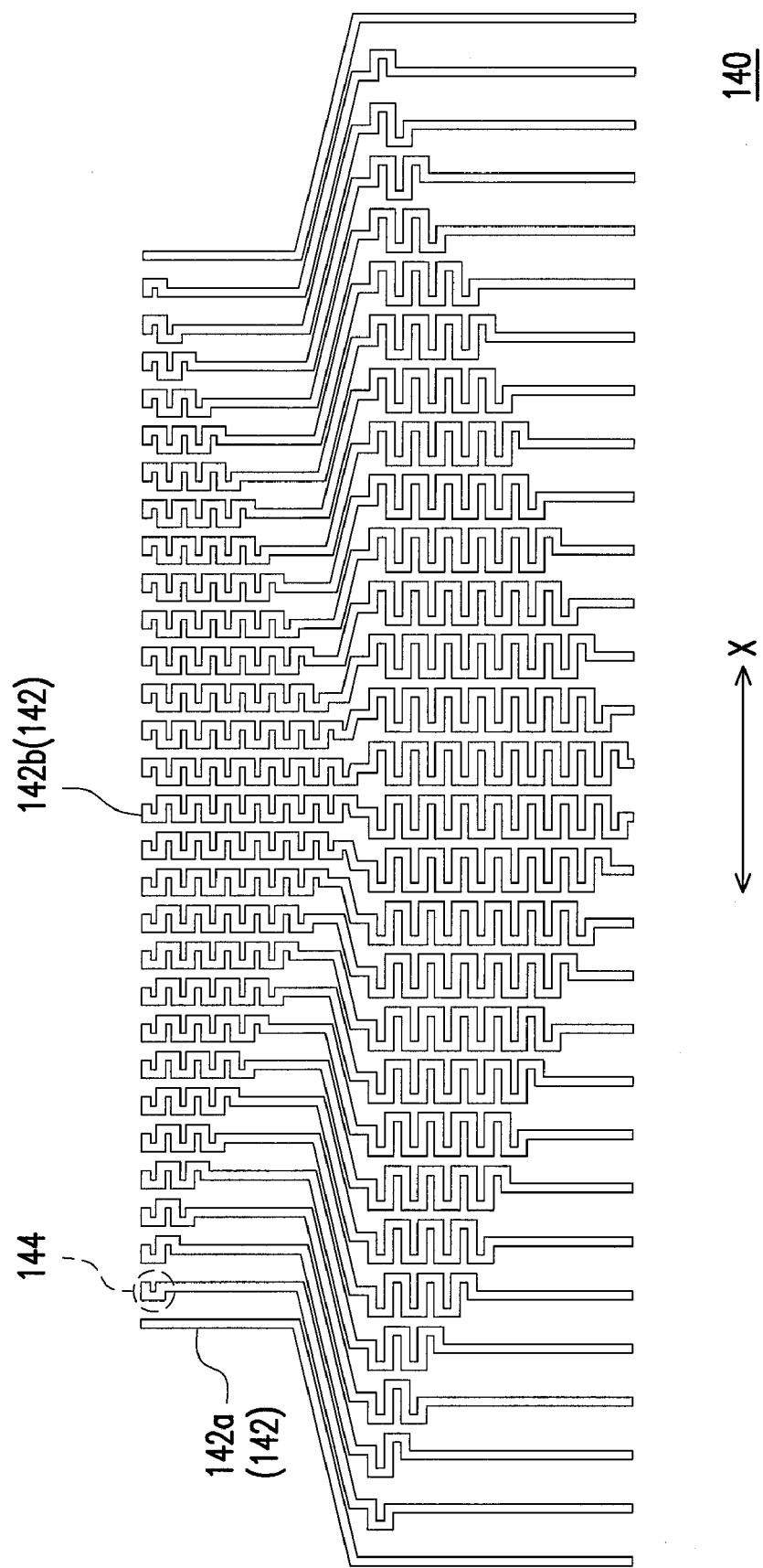
FIG. 1B illustrates an enlarged schematic view of a fan-out circuit in the LCD panel shown in FIG. 1A.
Figure 2A:
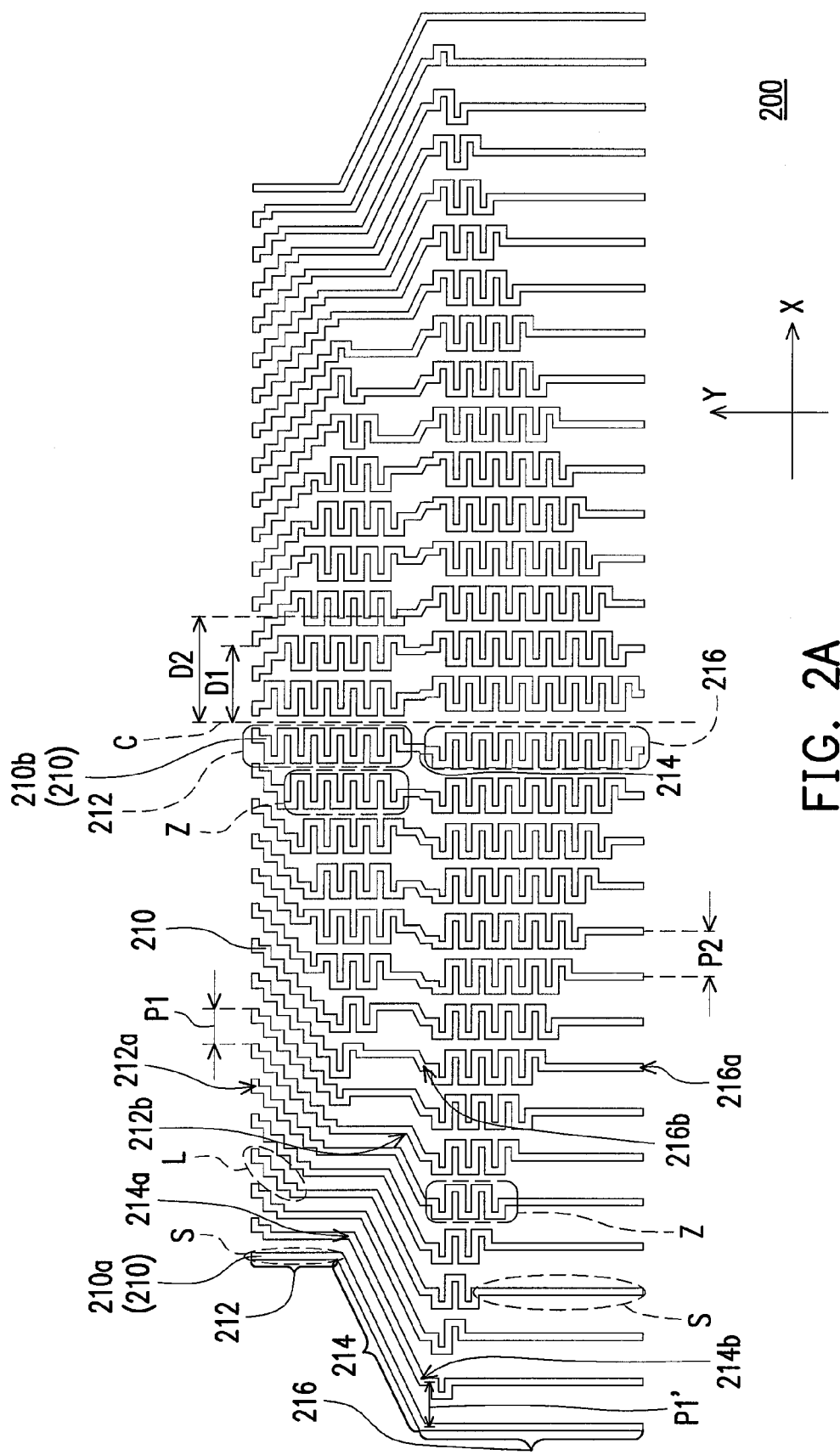
FIG. 2A illustrates a schematic view of a fan-out circuit according to an embodiment of the invention.

FIG. 2A illustrates a schematic view of a fan-out circuit according to an embodiment of the invention. Referring to FIG. 2A, a fan-out circuit 200 of the present embodiment includes a plurality of fan-out wirings 210 that are not electrically connected each other, or are electrically insulated from each other. Each fan-out wiring 210 includes a first detouring portion 212 and an extending portion 214. The first detouring portion 212 has a chip bonding terminal 212a and a first connecting terminal 212b. A pitch of any two adjacent chip bonding terminals 212a is P1. The extending portion 214 has a first terminal 214a and a second terminal 214b. The first terminal 214a is connected to the first connecting terminal 212b. A pitch of any two adjacent second terminals 214b is P1' and P1'>P1. In the fan-out wirings 210, a part of the first detouring portions 212 has a ladder shaped pattern L. That is, a part of the first detouring portions 212 has the ladder shaped pattern L and a non-ladder shaped pattern, and the ladder shaped pattern L is connected to the non-ladder shaped pattern, as shown in FIG. 2A. The non-ladder shaped pattern can be a zigzag pattern Z. In the present embodiment, the so called zigzag pattern Z means that the pattern extends in a zigzag manner along a fixed direction, such as extends along a fixed X coordinate or a fixed Y coordinate.

In addition, an X coordinate (and/or a Y coordinate) of the chip bonding terminal 212a of the first detouring portions 212 is different from an X coordinate (and/or a Y coordinate) of the first connecting terminal 212b thereof.

Practically, each the fan-out wiring 210 can further include a second detouring portion 216 depending on different demands in circuit layout. Each second detouring portion 216 has a signal-line connecting terminal 216a and a second connecting terminal 216b. The second connecting terminal 216b is connected to the first connecting terminal 212b through the extending portion 214. Also, a part of the second detouring portions 216 has a zigzag pattern Z. A pitch of any two adjacent signal-line connecting terminals 216a is P2, and P2>P1.

In the present embodiment, the fan-out wirings 210 are arranged on respective sides of a virtual center line C as two parts, for example. The two parts, for instance, are symmetrical to each other relative to the virtual center line C. A shortest distance between the virtual center line C and the chip bonding terminal 212a of a part of the first detouring portions 212 is D1. Moreover, a shortest distance between the virtual center line C and the first connecting terminal 212b of a part of the first detouring portions 212 is D2. Due to the design of the ladder shaped pattern L, D1<D2 in the present embodiment. In practice, in the first detouring portions 212 of a part of fan-out wirings 210a, D1=D2. In other words, a part of the first detouring portions 212 is parallel to the virtual center line C.

In details, the ladder shaped pattern L is formed by connecting a plurality of L-shaped unit patterns, for example. In the ladder shaped pattern L which is located on the left side of the virtual center line C, a distance between the part and the virtual center line C becomes smaller as the part gets closer to the chip bonding terminal 212a. Similarly, in the ladder shaped pattern L which is located on the right side of the virtual center line C, a distance between the part and the virtual center line C becomes smaller as the part gets closer to the chip bonding terminal 212a. Furthermore, in a variation trend of the length of the ladder shaped pattern L, the length is gradually lengthened and then gradually shortened from the virtual center line C in an outwardly fashion. As a consequence, the design of the ladder shaped pattern L preserves a larger layout area (approximately showing a triangular distribution) close to the virtual center line C to enhance the layout flexibility of the fan-out circuit 200.

In the fan-out wirings 210, a part of the first detouring portions 212 has the ladder shaped pattern L and another part of the first detouring portions 212 includes both the ladder shaped pattern L and the zigzag pattern Z. The zigzag pattern Z is constituted by a plurality of unit patterns, for example. The zigzag pattern Z, for example, is located between a part of the ladder shaped pattern L and the extending portions 214. In particular, the ladder shaped pattern L is a pattern design obliquely distributed relative to an extending direction of the virtual center line C. The zigzag pattern Z is a pattern design distributed in parallel to the extending direction of the virtual center line C. In other words, the ladder shaped pattern L and the zigzag pattern Z both complete the detouring pattern design by bending. However, the distributions of the ladder shaped pattern L and the zigzag pattern Z are different.

The oblique ladder shaped pattern L preserves a larger layout area close to the virtual center line C. Therefore, in the fan-out wirings 210 with the zigzag pattern Z, a zigzag margin of the zigzag pattern Z is not limited within a specific layout width, so that the layout of the fan-out wirings 210 is more flexible. It should be noted that the zigzag margin of the zigzag pattern Z is defined as a distance between an edge of the zigzag pattern Z closest to the virtual center line C and an edge of the zigzag pattern farthermost to the virtual center line C.

Figure 2B:
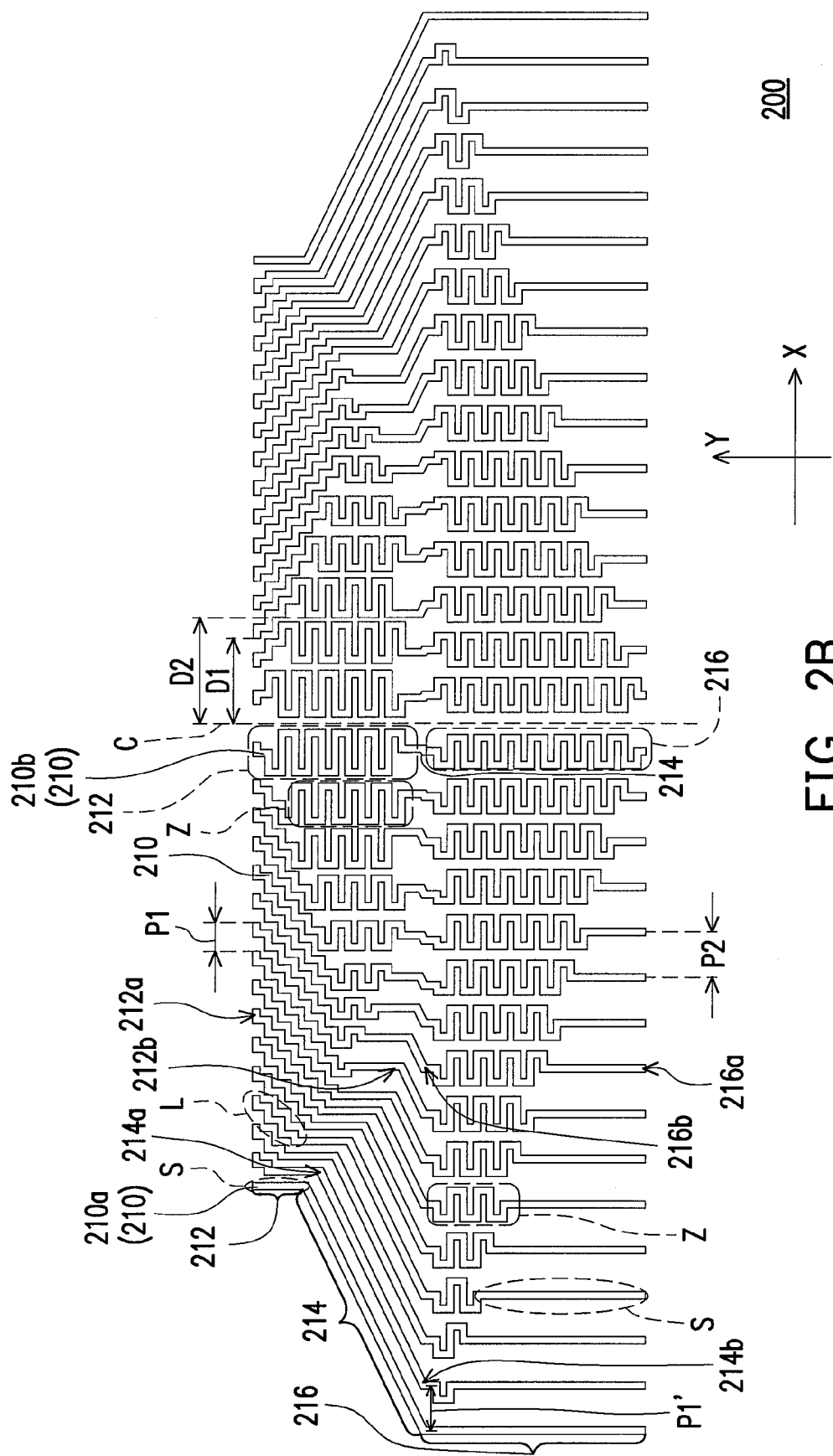
FIG. 2B illustrates a schematic view of a fan-out circuit according to another embodiment of the invention.

FIG. 2B illustrates a schematic view of a fan-out circuit according to another embodiment of the invention. Referring to FIG. 2B, a difference between the fan-out circuit 200 in FIG. 2B and the fan-out circuit 200 in FIG. 2A is that the zigzag margin of the zigzag pattern Z is gradually reduced from the virtual center line C to the respective sides, for example. That is, in fan-out wirings 210b that are closer to the virtual center line C, the zigzag pattern Z has an expanded zigzag margin. In other words, the fan-out wirings 210b that are closer to the virtual center line C have a longer detouring length. Therefore, when the fan-out wirings 210a and the fan-out wirings 210b have a great difference in the layout length, the fan-out wirings 210b can reduce the impedance difference between the fan-out wirings 210a and the fan-out wirings 210b effectively. The length of the zigzag pattern Z is also gradually reduced from the virtual center line C to the respective sides, and therefore provides optimal impedance compensation. Consequently, the impedance difference between the fan-out wirings 210a and the fan-out wirings 210b of the present embodiment is reduced effectively, such that the fan-out circuit 200 has a uniform signal transmission quality.

More specifically, in the design of the actual fan-out circuit 200, a part of the first detouring portions 212 has a striped pattern S. Obviously, a part of the second detouring portions 216 also has the stripe pattern S. For example, the fan-out wirings 210a farthermost from the virtual center line C constitute the first detouring portions 212 and the second detouring portions 216 with the stripe pattern S. Further, as shown in FIG. 2, a part of the fan-out wirings 210 is constituted by the stripe pattern S and the ladder shaped pattern L. Notably, the stripe pattern S is a linear segment parallel to the extending direction of the virtual center line C, for example.

In the present embodiment, the stripe pattern S, the ladder shaped pattern L, and the zigzag pattern Z are capable of providing compensations of different degrees. Thus, by incorporating different patterns, the design of the fan-out circuit 200 becomes more flexible, and the fan-out circuit 200 also has superior signal transmission quality.

For example, in a part of the fan-out wirings 210 having longer layout paths, the design of the stripe pattern S and the ladder shaped pattern L, or even the design of only the stripe pattern S is adopted to prevent the length from being too long so as to increase the impedance excessively. On the contrary, in a part of the fan-out wirings 210 having shorter layout paths, a circuitous design is adopted to increase impedance. That is, a part of the fan-out wirings 210 having short layout paths adopts the design of the ladder shaped pattern L and the zigzag pattern Z. The design of the ladder shaped pattern L preserves a layout region with greater width, so that the zigzag margin of the zigzag pattern Z is expanded or reduced according to various demands. Overall, the design of the first detouring portions 212 of the present embodiment effectively adjusts the impedance of all of the fan-out wirings 210 in the fan-out circuit 200.

In the design of the fan-out wirings 200 according to different embodiments of the invention, the fan-out wirings 210 with the chip bonding terminals 210a closer to the virtual center line C have shorter layout paths. For each fan-out wiring 210 to obtain a uniform impedance, the first detouring portions 212 of the fan-out wirings 210 become longer as the chip bonding terminal 210a gets closer to the virtual center line C. Generally, the fan-out wirings 210 are symmetrically arranged on the respective sides of the virtual center line C. Obviously, whether the fan-out circuit 200 are arranged symmetrically depends on the actual design, and the present embodiment is not limited herein.

Figure 3:
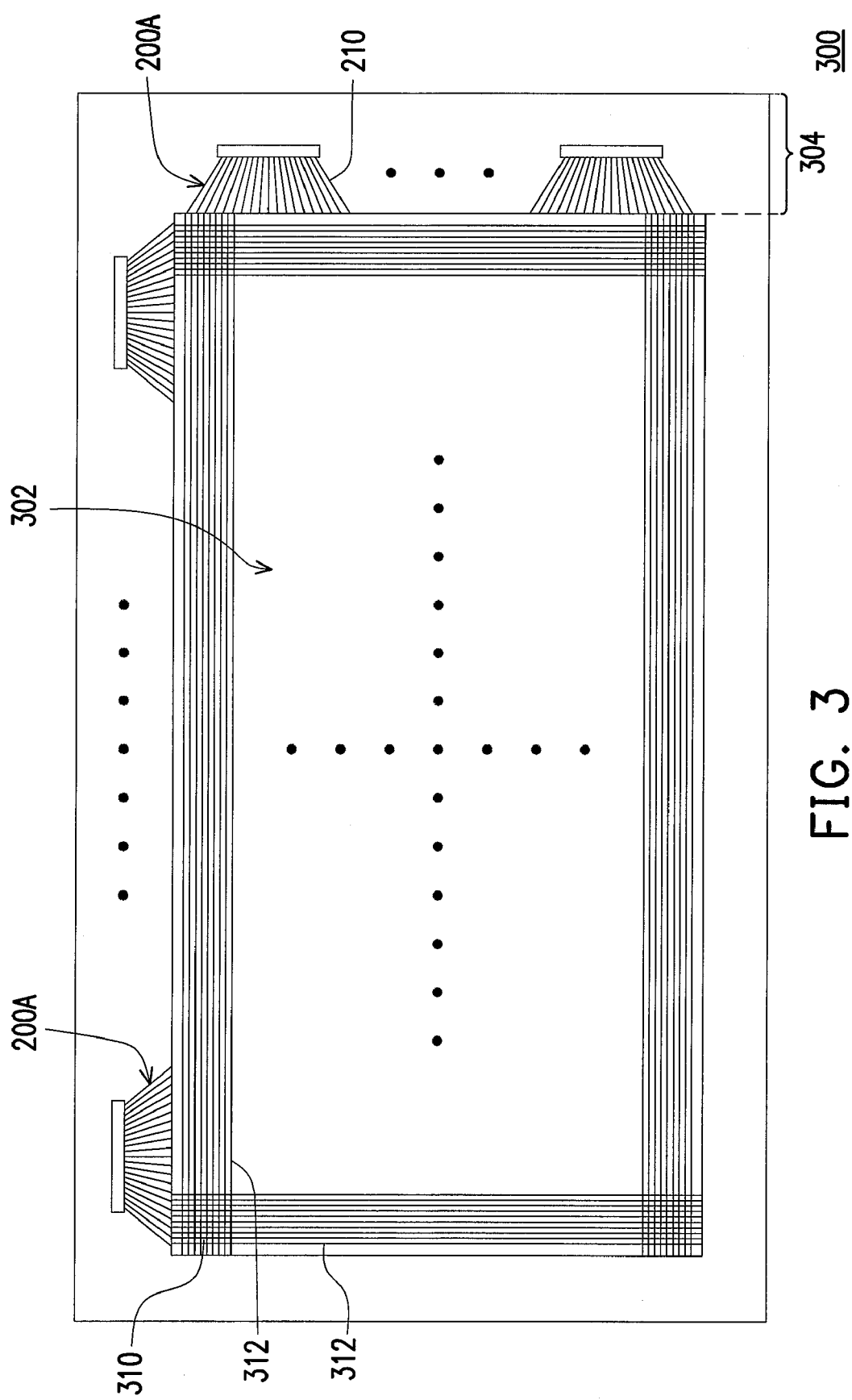
FIG. 3 illustrates a display panel according to an embodiment of the invention.

As for design of the fan-out circuit 200, the signal wires having the pitch P2, so that the pitch between the wirings is reduced to P1, and the transmission impedance of the signal-wires is uniform. Therefore, the fan-out circuit 200 can be adopted in products with demands for higher signal transmission quality. FIG. 3 illustrates a display panel according to an embodiment of the invention, for example. Referring to FIG. 3, a display panel 300 includes a display unit array 310 and the fan-out circuit 200A. The fan-out circuit 200A can be the fan-out circuit 200 illustrated in the embodiments aforementioned. The display unit array 310 is disposed within a display region 302 and includes a plurality of signal lines 312. The fan-out circuit 200A is disposed within a fan-out region 304. The fan-out wirings 210 are each electrically connected to a corresponding signal line 312.

The display unit array 310 is driven by a plurality of driving ICs (not illustrated) with a particular specification. The fan-out circuit 200A is configured to concentrate the signal lines 312 so as to connect the signal lines 312 to the driving ICs with the particular specification. In order to maintain superior display quality, each signal line 312 preferably has an identical or a mutually compatible transmission impedance. In the present embodiment, the fan-out circuit 200A effectively adjusts the impedance of all fan-out wirings 210. Therefore, the design of the fan-out circuit 200A facilitates in enhancing the quality of the display panel 300. However, the application of the fan-out circuit 200A in the display panel 300 is not limited in the invention.

In summary, the fan-out circuit of the invention has a ladder shaped pattern design, so that the layout of the fan-out circuit can be flexible. In the design of the ladder shaped pattern, the fan-out circuit of the invention effectively adjusts the impedance of various fan-out wirings. More specifically, the two terminals of the ladder shaped pattern and the virtual center line of the fan-out circuit are spaced with different distances, so that a part of the fan-out wirings has sufficient layout area. Hence, the fan-out wirings enhance the impedance by increasing the detouring length depending on various demands, so that the fan-out circuit has superior impedance uniformity. When this fan-out circuit is adopted in the display panel or other apparatuses that require the wirings to have mutually compatible impedance, the signal transmission quality of the display panel or apparatuses can be enhanced.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:
1. A fan-out circuit, comprising:
   a plurality of fan-out wirings, the plurality of fan-out wirings being arranged on respective sides of a virtual center line, wherein each of the plurality of fan-out wirings comprises:
   a first detouring portion having a chip bonding terminal and a first connecting terminal, wherein a pitch of any two adjacent chip bonding terminals is P1; and
   an extending portion having a first terminal and a second terminal, wherein the first terminal is connected to the first connecting terminal, and a pitch of any two adjacent second terminals is P1' and P1'>P1, wherein the first detouring portions of a portion of the plurality of fan-out wirings respectively have a ladder shaped pattern, and the lengths of the ladder shaped patterns are gradually lengthened and then gradually shortened from the virtual center line in an outwardly fashion.

2. The fan-out circuit as claimed in claim 1, wherein the first detouring portions of another portion of the plurality of fan-out wirings have the ladder shaped pattern and a zigzag pattern.

3. The fan-out circuit as claimed in claim 2, wherein a shortest distance between the virtual center line and the chip bonding terminal of a part of the first detouring portions is D1, a shortest distance between the virtual center line and the first connecting terminal of a part of the first detouring portions is D2, and D1<D2.

4. The fan-out circuit as claimed in claim 3, wherein a zigzag margin of the zigzag pattern is gradually reduced from the virtual center line to the respective sides.

5. The fan-out circuit as claimed in claim 3, wherein a length of the zigzag pattern is gradually reduced from the virtual center line to the respective sides.

6. The fan-out circuit as claimed in claim 1, wherein the first detouring portions of another portion of the plurality of fan-out wirings have the ladder shaped pattern, a zigzag pattern, and a stripe pattern.

7. The fan-out circuit as claimed in claim 6, wherein a shortest distance between the virtual center line and the chip bonding terminal of the first detouring portion of the at least one of the plurality of fan-out wirings is D1, a shortest distance between the virtual center line and the first connecting terminal of the first detouring portion of the at least one of the plurality of fan-out wirings is D2, and D1<D2.

8. The fan-out circuit as claimed in claim 7, wherein a zigzag margin of the zigzag pattern is gradually reduced from the virtual center line to the respective sides.

9. The fan-out circuit as claimed in claim 7, wherein a length of the zigzag pattern is gradually reduced from the virtual center line to the respective sides.

10. The fan-out circuit as claimed in claim 1, wherein the plurality of fan-out wirings are symmetrically arranged on respectively sides of the virtual center line.

11. The fan-out circuit as claimed in claim 1, wherein each of the plurality of fan-out wirings further comprises a second detouring portion having a second connecting terminal and a signal-line connecting terminal, wherein the second connecting terminal is connected to the first connecting terminal through the extending portion and a pitch of any two adjacent signal-line connecting terminals is P2, and P2>P1.

12. The fan-out circuit as claimed in claim 1, wherein an X coordinate of the chip bonding terminal of the first detouring portion is different from an X coordinate of the first connecting terminal while a Y coordinate of the chip bonding terminal of the first detouring portion is different from a Y coordinate of the first connecting terminal.

13. A display panel, comprising:
a display unit array, disposed within a display region, comprising a plurality of signal lines; and
a fan-out circuit, disposed within a fan-out region, comprising:
a plurality of fan-out wirings, the plurality of fan-out wirings being arranged on respective sides of a virtual center line, wherein each of the plurality of fan-out wirings comprises:
a first detouring portion having a chip bonding terminal and a first connecting terminal, wherein a pitch of any two adjacent chip bonding terminals is P1; and
an extending portion having a first terminal and a second terminal, wherein the first terminal is connected to the first connecting terminal, and a pitch of any two adjacent second terminals is P1' and P1'>P1,
wherein the first detouring portions of a portion of the plurality of fan-out wirings respectively have a ladder shaped pattern, and the lengths of the ladder shaped patterns are gradually lengthened and then gradually shortened from the virtual center line in an outwardly fashion, and
wherein each of the plurality of fan-out wirings is electrically connected to one of the signal lines respectively.

14. A fan-out circuit, comprising:
a plurality of fan-out wirings, the plurality of fan-out wirings being arranged on respective sides of a virtual center line, wherein the plurality of fan-out wirings are not electrically connected to each other, and each of the plurality of fan-out wirings comprises a first detouring portion having a chip bonding terminal and a first connecting terminal,
in the plurality of fan-out wirings, a part of the first detouring portion has a ladder shaped pattern and a non-ladder shaped pattern, and the lengths of the ladder shaped patterns are gradually lengthened and then gradually shortened from the virtual center line in an outwardly fashion.

15. The fan-out circuit as claimed in claim 14, wherein the part of the first detouring portion has the ladder shaped pattern and a zigzag pattern.

16. A fan-out circuit, comprising:
a plurality of fan-out wirings, the plurality of fan-out wirings being arranged on respective sides of a virtual center line, wherein the plurality of fan-out wirings are not electrically connected to each other and each of the plurality of fan-out wirings comprises:
a first detouring portion having a chip bonding terminal and a first connecting terminal, wherein in the plurality of fan-out wirings, a part of the first detouring portions has a ladder shaped pattern, and the lengths of the ladder shaped patterns are gradually lengthened and then gradually shortened from the virtual center line in an outwardly fashion;
an extending portion having a first terminal and a second terminal, wherein the first terminal is connected to the first connecting terminal; and
wherein an X coordinate of the chip bonding terminal of the first detouring portion is different from an X coordinate of the first connecting terminal while a Y coordinate of the chip bonding terminal of the first detouring portion is different from a Y coordinate of the first connecting terminal.

17. The fan-out circuit as claimed in claim 16, wherein the fan-out wiring further comprises a second detouring portion, having a second connecting terminal and a signal-line connecting terminal, wherein the second connecting terminal is connected to the first connecting terminal through the extending portion.

* * * * *